(12) United States Patent
Lee et al.

(10) Patent No.: US 7,205,609 B2
(45) Date of Patent: Apr. 17, 2007

(54) METHODS OF FORMING SEMICONDUCTOR DEVICES INCLUDING FIN STRUCTURES AND RELATED DEVICES

(75) Inventors: Deok-Hyung Lee, Gyeonggi-do (KR);
Si-Young Choi, Gyeonggi-do (KR);
Byeong-Chan Lee, Gyeonggi-do (KR);
Yong-Hoon Son, Gyeonggi-do (KR);
In-Soo Jung, Gyeonggi-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 224 days.

(21) Appl. No.: 10/853,616

(22) Filed: May 25, 2004

(65) Prior Publication Data

US 2005/0072992 A1 Apr. 7, 2005

(30) Foreign Application Priority Data

Oct. 1, 2003 (KR) .................... 10-2003-0068407

(51) Int. Cl.
*H01L 29/78* (2006.01)
(52) U.S. Cl. .................... 257/346; 257/382; 257/401
(58) Field of Classification Search ................ 257/346
See application file for complete search history.

(56) References Cited

U.S. PATENT DOCUMENTS

| 6,365,465 | B1 * | 4/2002 | Chan et al. | 438/283 |
| 6,406,973 | B1 * | 6/2002 | Lee | 438/416 |
| 6,483,148 | B2 | 11/2002 | Chan et al. | |
| 6,551,885 | B1 * | 4/2003 | Yu | 438/300 |
| 6,911,697 | B1 * | 6/2005 | Wang et al. | 257/347 |
| 2002/0171107 | A1 * | 11/2002 | Cheng et al. | 257/347 |

FOREIGN PATENT DOCUMENTS

JP 10/189966 A 7/1998
KR 2003-0032239 A 4/2003

* cited by examiner

*Primary Examiner*—Stephen W. Smoot
(74) *Attorney, Agent, or Firm*—Myers Bigel Sibley & Sajovec

(57) ABSTRACT

A method of forming a semiconductor device may include forming a fin structure extending from a substrate. The fin structure may include first and second source/drain regions and a channel region therebetween, and the first and second source/drain regions may extend a greater distance from the substrate than the channel region. A gate insulating layer may be formed on the channel region, and a gate electrode may be formed on the gate insulating layer so that the gate insulating layer is between the gate electrode and the channel region. Related devices are also discussed.

24 Claims, 18 Drawing Sheets

METHODS OF FORMING SEMICONDUCTOR DEVICES INCLUDING FIN STRUCTURES AND RELATED DEVICES

RELATED APPLICATION

This application claims the benefit of priority from Korean Application No. 2003-0068407 filed Oct. 1, 2003, the disclosure of which is hereby incorporated herein in its entirety by reference.

FIELD OF THE INVENTION

The present invention generally relates to semiconductor devices and more particularly, the present invention relates to field effect transistors and methods of forming the same.

BACKGROUND

Generally, a field effect transistor (hereinafter, referred to as a transistor) of a semiconductor device may include source/drain regions that are spaced from each other at a semiconductor substrate (hereinafter, referred to as a substrate) and a gate electrode on a channel region between the source/drain regions.

As semiconductor devices become more highly integrated, sizes of transistors may be gradually reduced and these size reductions may result in problems. For example, a reduction in channel length may degrade a punch through characteristic between source/drain regions, and a controllability of a gate electrode with respect to a channel region may be degraded thereby increasing leakage currents. Fin field effect transistors (Fin FETs) have been introduced to address these issues.

A Fin FET includes a gate electrode crossing over a silicon fin protruding from a substrate. The silicon fin under the gate electrode corresponds to a channel region. The gate electrode passes over both sidewalls of the silicon fin. Because both sidewalls of the silicon fin can be used as a channel region controlled by the gate electrode, controllability of the gate electrode may be improved. A Fin FET may include source/drain regions of the silicon fin at both sides of the channel region. A characteristic such as punch through between the source/drain regions may thus be improved.

According to a conventional method of forming a Fin FET, a gate electrode may be formed after forming a silicon fin. That is, a gate conductive layer may be formed over the silicon fin, and patterned to form the gate electrode. The gate conductive layer may be patterned using an anisotropic etch process. During the patterning process, source/drain regions may be damaged due to over etch. More particularly, a gate insulation layer exposed at edges of the gate electrode and disposed on the silicon fin may be undesirably etched because the gate conductive layer disposed on both sidewalls of the protruding silicon fin may have a relatively high vertical height. If the thickness of a gate insulation layer at edges of the gate electrode is significantly reduced due to an over etch, a gate-induced drain leakage (GIDL) may increase thereby degrading characteristics of the Fin FET.

Additionally, a horizontal area between the source/drain regions may be relatively thin because the source/drain regions are formed in the silicon fin. A contact resistance between an upper conductor and the source/drain regions may also increase.

SUMMARY

According to some embodiments of the present invention, methods of forming a semiconductor device include forming a fin structure extending from a substrate. The fin structure includes first and second source/drain regions and a channel region therebetween, and the first and second source/drain regions extend a greater distance from the substrate than the channel region. A gate insulating layer is formed on the channel region, and a gate electrode is formed on the gate insulating layer so that the gate insulating layer is between the gate electrode and the channel region.

The gate insulating layer may be on sidewalls of the channel region and on a surface of the channel region opposite the substrate, and portions of the first and second source/drain regions adjacent the channel region may include an impurity doped semiconductor material. Before forming the gate electrode, insulating spacers may be formed on portions of the fist and second source/drain regions extending beyond the channel region so that the insulating spacers separate the first and second source/drain regions from portions of the gate electrode between the first and second source/drain regions.

The gate electrode may include doped polysilicon, a polycide, a metal silicide, a material including a conductive metal, and/or combinations thereof. Moreover, portions of the first and second source/drain regions may include a metal silicide, and a least distance of the metal silicide from the substrate may be at least as great as a distance that the channel region extends from the substrate. The fin structure and the substrate may both include a same semiconductor material such as silicon.

An insulating mold layer may also be formed on the substrate and adjacent the fin structure, and surfaces of the first and second source/drain regions may be exposed through the insulating mold layer. In addition, the insulating mold layer may have a groove therein extending through a gap in the fin structure between the first and second source/drain regions. A portion of the channel region may extend into the groove, and the gate electrode may be in the groove on opposite sides of the portions of the channel region extending into the groove. Moreover, sidewalls of the groove may expose portions of the first and second source/drain regions extending beyond the channel region, and insulating spacers may be formed on sidewalls of the groove and on the portions of the first and second source/drain regions exposed by the groove. An insulating capping layer may also be formed on the gate electrode such that the gate electrode is between the insulating capping layer and the substrate, and the insulating capping layer may include an insulating material having a projected implant range lower than a projected implant range of the fin structure when implanting impurity ions.

More particularly, forming the fin structure may include forming a preliminary fin structure extending from the substrate and forming a mold layer on the substrate and adjacent the preliminary fin structure such that a surface of the preliminary fin structure is exposed through the mold layer. A groove may then be formed in the mold layer and in the preliminary fin structure so that the groove is between portions of the first and second source/drain regions and so that a portion of the channel region extends into the groove. Before forming the gate electrode, insulating spacers may be formed along sidewalls of the groove so that the insulating spacers are between the gate electrode and portions of the first and second source/drain regions.

Forming the groove may include forming a mask layer having an opening therein exposing portions of the mold layer and the preliminary fin structure, and selectively removing portions of the mold layer and the preliminary fin pattern exposed by the opening in the mask layer to a substantially same depth to provide a preliminary groove. Insulating spacers may be formed along sidewalls of the preliminary groove, and after forming the insulating spacers, portions of the mold layer exposed between the insulating spacers may be removed with portions of the mold layer being removed selectively with respect to the channel region. A surface treatment may also be performed after forming the groove and before forming the gate insulating layer to cure exposed portions of the channel region. In addition, impurity ions may be selectively implanted into the channel region before forming the gate electrode.

Forming the gate electrode may include forming a layer of a conductive material on the mold layer and in the groove, removing portions of the conductive material outside the groove, and recessing the conductive material in the groove. In addition, a capping layer may be formed in the groove on the gate electrode. After forming the capping layer, impurity ions may be implanted into the first and second source/drain regions of the fin structure. After forming the capping layer, an insulating layer may be formed on the mold layer, on the capping layer, and on portions of the source/drain regions, and the insulating layer may have contact holes therein exposing portions of the source/drain regions. Moreover, conductive vias may be formed in the contact holes electrically coupled with the source/drain regions.

In an alternative, before forming the groove, a mask may be formed covering a central portion of the preliminary fin structure and exposing portions of the preliminary fin structure on either side of the central portion. Impurity ions may then be implanted into exposed portions of the preliminary fin structure on either side of the mask.

According to additional embodiments of the present invention, a semiconductor device may include a fin structure extending from a substrate, a gate insulating layer, and a gate electrode. The fin structure includes first and second source/drain regions and a channel region therebetween, and the first and second source/drain regions extend a greater distance from the substrate than the channel region. The gate insulating layer is on the channel region, and the gate electrode is on the gate insulating layer so that the gate insulating layer is between the gate electrode and the channel region.

The gate insulating layer may be on sidewalls of the channel region and on a surface of the channel region opposite the substrate, and portions of the first and second source/drain regions adjacent the channel region may include an impurity doped semiconductor material. The semiconductor device may also include insulating spacers between the gate electrode and portions of the first and second source/drain regions extending beyond the channel region. In addition, the gate electrode may include doped polysilicon, a polycide, a metal silicide, a material including a conductive metal, and/or combinations thereof. Moreover, portions of the first and second source/drain regions may include a metal silicide, and a least distance of the metal silicide from the substrate may be at least as great as a distance that the channel region extends from the substrate.

The semiconductor device may also include an insulating mold layer on the substrate and adjacent the fin structure. More particularly, surfaces of the first and second source/drain regions may be exposed through the insulating mold layer, and the insulating mold layer may have a groove therein extending through a gap in the fin structure between the first and second source/drain regions. A portion of the channel region extends into the groove, and the gate electrode may be in the groove on opposite sides of the portions of the channel region extending into the groove. Moreover, sidewalls of the groove may expose portions of the first and second source/drain regions extending beyond the channel region, and insulating spacers may be provided on sidewalls of the groove and on the portions of the first and second source/drain regions exposed by the groove.

In addition, an insulating capping layer may be included on the gate electrode such that the gate electrode is between the insulating capping layer and the substrate. The insulating capping layer may include an insulating material having a projected implant range lower than a projected implant range of the fin structure when implanting impurity ions. In addition, the fin structure and the substrate may both include a same semiconductor material such as silicon.

Semiconductor devices that can reduce resistances of source/drain regions and methods of forming the same may be provided according to some embodiments of the present invention. In addition or in an alternative, semiconductor devices that can reduce etch damage to source/drain regions and methods of forming the same may be provided according to some embodiments of the present invention.

According to additional embodiments of the present invention a semiconductor device may include a fin pattern on a substrate. The fin pattern includes a channel region, a source region and a drain region connected to both sides of the channel region. The source and drain regions may have greater heights than the channel region. A gate electrode is provided to cross over a top surface and both sidewalls of the channel region. A gate insulation layer is interposed between the gate electrode and the channel region. Impurity-doped regions are provided at least at the source region and the drain region.

Spacers may be interposed at least between the gate electrode and a sidewall of the source region and between the gate electrode and a sidewall of the drain region. The spacers may be on a sidewall of the source region and on a sidewall of the drain region adjacent to the gate electrode. The gate electrode may include doped polysilicon, a polycide, a metal silicide, a material including a conductive metal, and/or combinations thereof. The semiconductor device may also include a metal silicide layer at a part of the impurity-doped region. A bottom surface of the metal silicide layer may have a height substantially the same as or higher than a height of a top surface of the channel region. The semiconductor device may further include a mold layer covering the fin pattern to expose a top surface of the fin pattern on the substrate and having a groove crossing over the fin pattern. A portion of the channel region may protrude from a bottom surface of the groove. Inner sidewalls of the groove may expose side surfaces of the source region and the drain region adjacent to the gate electrode. The gate electrode may cross over the protruded channel region in the groove. Spacers may be disposed on inner sidewalls of the groove including the exposed source region and drain regions. The gate electrode over at least the channel region may be interposed between the spacers. A capping pattern may be disposed on the gate electrode. The capping pattern may be of an insulation material having a lower projected range of impurity ion penetration than the fin pattern.

According to additional embodiments of the present invention, methods of forming a semiconductor device may include forming a fin pattern on a substrate. The fin pattern may include a channel region, and source and drain regions connected to opposite sides of the channel region. The source and drain regions may have heights greater than that of the channel region. A gate insulation layer may be formed at least at a top surface and both sidewalls of the channel region. And a gate electrode may be formed to cross over a top surface and both sidewalls of the channel region on the gate insulation layer.

Before forming the gate electrode, spacers may be formed at sidewalls of the source region and the drain region adjacent to the channel region. The fin pattern may be formed by the following sequences. First, a preliminary fin pattern may be formed to protrude from a substrate. A planarized mold layer may be formed to expose a top surface of the preliminary fin pattern on the substrate. Then, the mold layer and the preliminary fin pattern may be patterned to form a groove exposing sidewalls of the source region and the drain region at both sidewalls of the groove. The channel region may protrude from a bottom surface of the groove. In this case, before forming the gate electrode, spacers may be formed to cover the exposed source region and the drain region at inner sidewalls of the groove. Impurity-doped regions may be formed at least at the source region and the drain region, respectively. A metal silicide layer may be formed at parts of the source region and the drain region. A bottom surface of the metal silicide layer preferably has a height identical with or higher than a height of a top surface of the channel region.

According to some embodiments of the present invention, a preliminary fin pattern may be formed to protrude from a substrate. A mold layer is formed and planarized to expose a top surface of the preliminary fin pattern on the substrate. A hard mask layer is formed to have an opening exposing predetermined regions of the mold layer and the preliminary fin pattern. A fin pattern, a groove and spacers are formed. The fin pattern includes a source region, a channel region and a drain region. The groove includes a bottom surface where the channel region protrudes and inner sidewalls where sidewalls of the source region and the drain region are exposed. The spacer covers sidewalls of the exposed source region and drain regions. A gate insulation layer is formed at an exposed surface of the channel region. A gate electrode is formed to cross over a top surface and both sidewalls of the channel region in the groove. The source region and the drain region may have heights greater than the channel region.

More particularly, the fin pattern, the groove and the spacers may be formed by the following sequences. First, the mold layer and the preliminary fin pattern exposed by the opening may be selectively etched to form the fin pattern and a preliminary groove including both inner sidewalls, where sidewalls of the source region and the drain region are exposed and a bottom surface where a top surface of the channel region is exposed. Spacers may be formed at both inner sidewalls of the preliminary groove. The mold layer may be recessed using the hard mask layer and the spacers as etch masks to form a groove where the channel region protrudes. After forming the groove, a surface treatment process may be performed to cure a surface of the protruded channel region. Before forming the gate electrode, impurity ions may be selectively implanted into the channel region to control a threshold voltage.

The gate electrode may be formed by the following sequences. First, a gate conductive layer may be formed on a surface of the substrate to fill the groove. The gate conductive layer may be planarized to expose the hard mask layer. Then, a top surface of the planarized gate conductive layer may be recessed to form the gate electrode. The gate electrode may be formed of doped polysilicon, a metal silicide, a polycide, a material including a conductive metal and/or combinations thereof. After forming the gate electrode, a capping layer may be formed on a surface of the substrate, and the capping layer and the hard mask layer may be planarized to expose the mold layer, the source region, and the drain region to form a capping pattern on the gate electrode. Then, a metal silicide layer may be formed at parts of the source region and the drain region. A bottom surface of the metal silicide layer may have a height substantially the same as or greater than a height of a top surface of the channel region. Before forming the metal silicide layer, impurity-doped regions may be formed at least at the source region and the drain region. The metal silicide layer may be formed at a part of the impurity-doped region.

The impurity-doped regions may be formed by the following sequences. A mask pattern may be formed to cross over the preliminary fin pattern on the mold layer and the preliminary fin pattern, and impurity ions may be implanted using the mask pattern as an ion implantation mask to form the impurity-doped regions. Alternatively, impurity ions may be implanted using the stacked gate electrode and the capping pattern as ion implantation masks to form impurity-doped regions at the source region and the drain region. The capping pattern may be formed of an insulation material having a lower projected range of impurity ion penetration than the fin pattern. After forming the metal silicide layer, an interlayer dielectric layer may be formed on the substrate. The interlayer dielectric layer may be patterned to form a contact hole exposing the metal silicide layer. Then, a conductive via (also referred to as an upper conductor) may be formed to fill the contact hole.

DETAILED DESCRIPTION

Figure 1A:
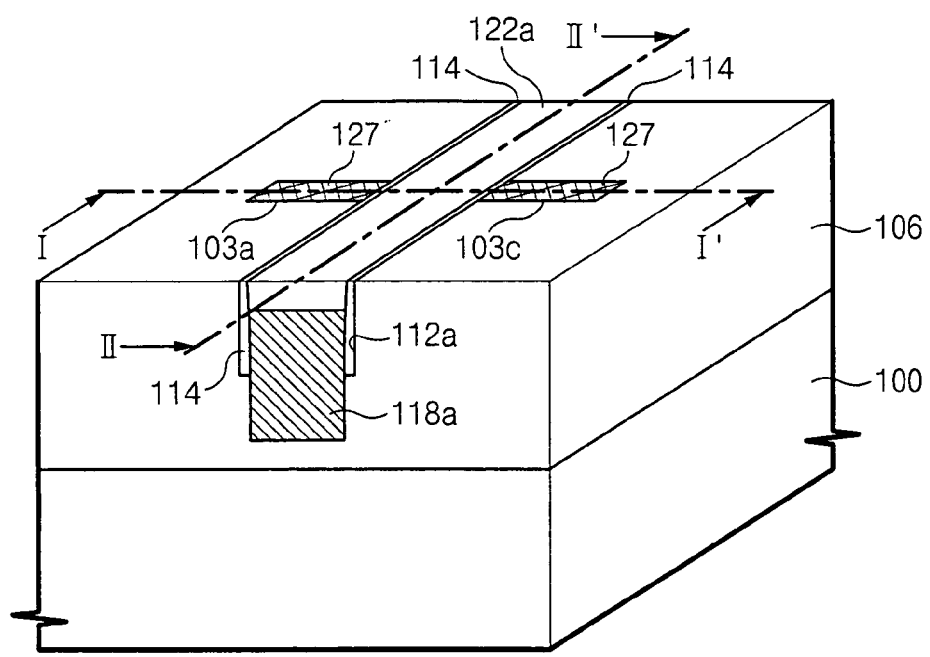
FIG. 1A is a perspective view of a semiconductor device according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. As used herein, the term and/or includes any and all combinations of one or more of the associated listed items.

Furthermore, relative terms, such as beneath, may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

Figure 1B:
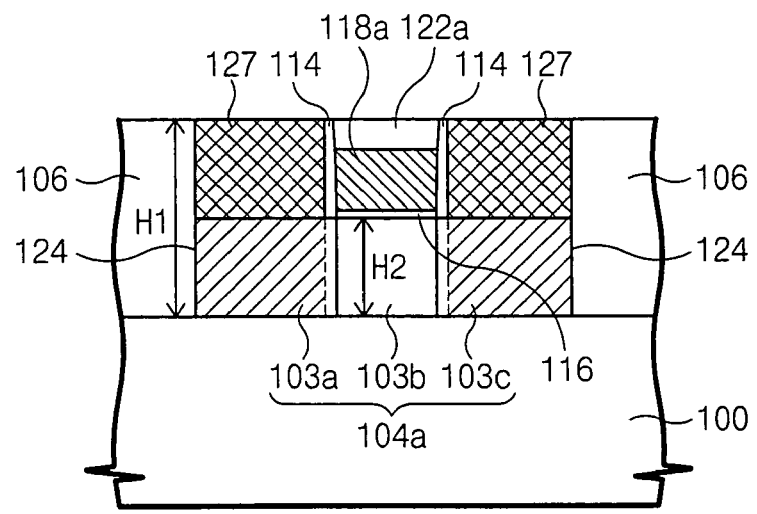
FIG. 1B is a cross-sectional view taken along line I–I' of FIG. 1A.

FIG. 1A is a perspective view of a semiconductor device according to embodiments of the present invention. FIG. 1B is a cross-sectional view taken along a line I–I' of FIG. 1A, and FIG. 1C is a cross-sectional view taken along line II–II' line of FIG. 1A.

Figure 1C:
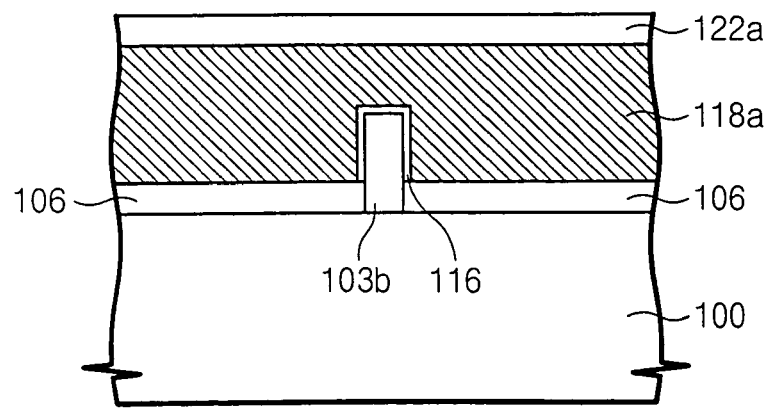
FIG. 1C is a cross-sectional view taken along line II–II' of FIG. 1A.

Referring to FIGS. 1A, 1B and 1C, a fin pattern 104a is provided on a substrate 100. The fin pattern 104a protrudes from the substrate 100. The fin pattern 104a includes a channel region 103b and, a source region 103a and a drain region 103c that are in contact with respective sides of the channel region 103b. The source region 103a and the drain region 103c have a first height H1 and the channel region 103b has a second height H2. The first height H1 may be greater than the second height H2. That is, the source region 103a and the drain region 103c have a greater height than the channel region 103b. The fin pattern 104a and the substrate 100 may include a same material such as silicon. For example, if the substrate 100 is a single-crystal silicon substrate, the fin pattern 104a may be single-crystal silicon. The channel region 103b corresponds to a channel region of a transistor, and the source/drain regions 103a and 103c correspond to source/drain regions of the transistor, respectively.

A gate electrode 118a is provided to cross over the fin pattern 104a. The gate electrode 118a crosses over the channel region 103b. That is, the gate electrode 118a passes over a top surface and both sidewalls of the channel region 103b. A gate insulation layer 116 is interposed between the gate electrode 118a and the channel region 103b.

The gate insulation layer 116 may be a layer of silicon oxide, such as a layer of silicon oxide formed using thermal oxidation. The gate electrode 118a may be a polysilicon electrode doped with impurities, and/or the gate electrode 118a may be partially or entirely a metal silicide. That is, the gate electrode 118a may be a polysilicon doped with impurities, a polycide and/or a metal silicide. The polycide may include a polysilicon doped with impurities and a metal silicide that are sequentially stacked. The metal silicide may be a silicide containing a refractory metal such as a nickel silicide, cobalt silicide, and/or a titanium silicide. Alternatively, the gate electrode 118a may be a metal-containing material such as titanium nitride, tantalum nitride, tungsten nitride, and/or molybdenum. Since the gate electrode 118a may be polysilicon doped with impurities, a metal silicide, and/or a metal-containing material, it may be possible to control a threshold voltage of a transistor.

Insulating spacers 114 are provided at the source/drain regions 103a and 103c adjacent to the gate electrode 118a. The gate electrode 118a is electrically isolated from the source/drain regions 103a and 103c by the spacers 114.

The source/drain regions 103a and 103c may be doped as indicated by the impurity-doped regions 124. The impurity-doped regions 124 may extend to a predetermined region of the channel region 103b under the spacer 114. That is, the impurity-doped regions 124 may be disposed in the fin pattern 104a at both sides of the gate electrode 118a. The impurity-doped regions 124, the channel region 103b and the gate electrode 118a may thus define a fin FET.

A metal silicide 127 is formed on portions of the impurity-doped regions 124. A bottom surface of the metal silicide 127 preferably has at least a same height as a top surface of the channel region 103b or a greater height than that. Since the source/drain region 103a and 103c have a greater height than the channel region 103b, the metal silicide 127 may be located in a higher position than the channel region 103b and have a relatively thick thickness. A resistance between the source/drain regions of the Fin FET can thus be reduced. A contact resistance between a conductive via (also referred to as an upper conductor) and the source/drain regions can be reduced to improve characteristics of a semiconductor device. Additionally, it is possible to reduce diffusion of metal elements in the metal silicide 127 into the channel region 103b.

In a conventional fin FET, a channel region may have a same height as source/drain regions. In this case, if a metal silicide is formed at surfaces of source/drain regions, the metal silicide may be provided with a relatively thin thickness. Otherwise, metal elements in the metal silicide may diffuse into the channel region to degrade characteristics of a transistor. If the metal silicide has a relatively thin thickness, the metal silicide may be partially cut due to grains of the metal silicide.

A mold layer 106 having a groove 112a may be provided on the substrate 100 to expose a top surface of the fin pattern 104a. A bottom surface of the fin pattern 104a may be connected to the substrate 100. A floating body effect that may otherwise result at a silicon on insulator (SOI) substrate may be reduced. Additionally, if heat is generated in the fin pattern 104a by repeatedly operating the Fin FET, the heat can be effectively conducted out through the substrate 100. A top surface of the mold layer 106 and top surfaces of the source/drain regions 103a and 103c may have substantially a same height.

The groove 112a crosses over the fin pattern 104a. A bottom surface of the groove 112a may be formed of the mold layer 106. The channel region 103b may protrude from the bottom surface of the groove 112a. That is, the groove 112a may expose a top surface and sidewalls of the protruding channel region 103b. Sidewalls of the source/drain regions 103a and 103c that are adjacent to the channel region 103b may be exposed at both inner sidewalls of the groove 112a, respectively. The inner sidewalls of the groove 112a may be aligned with sidewalls of the exposed source/drain regions 103a and 103c, respectively.

Spacers 114 are disposed on sidewalls of the exposed source/drain regions 103a and 103c, respectively. The spacers 114 may extend along the inner sidewalls of the groove 112a. Particularly, the inner sidewalls of the groove 112a may have a step form and the spacer 114 may extend along upper inner sidewalls of the groove 112a.

The gate insulation layer 116 is disposed on at least a top surface and both sidewalls of the channel region 103b exposed by the groove 112a. The gate electrode 118a may be disposed in the groove 112a along sidewalls thereof. A top surface of the gate electrode 118a may be substantially flat. The mold layer 106 surrounds a bottom part of the fin pattern 104a located under a protruding part of the channel region 103b and is interposed between the substrate 100 and a part of the gate electrode 118a located on the substrate 100 at both sides of the fin pattern 104a. Thus, the fin FET may be isolated from a neighboring other fin FET. That is, the mold layer 106 can function as a field isolation layer.

A top surface of the gate electrode 118a may have a lower height than a top surface of the mold layer 106. At this time, a capping pattern 122a may be disposed on the gate electrode 118a. The capping pattern 122a may fill the groove 112a. That is, a top surface of the capping pattern 122a and the top surface of the mold layer 106 may have substantially a same height. The capping pattern 122a may be formed of an insulating material such as silicon oxide. Alternatively, the capping pattern 122a may be formed of an insulating material having a lower projected range of impurity ion penetration than the fin pattern. For example, the capping pattern 122a may be formed of silicon nitride.

FIGS. 2A, 3A, 4A, 5A, 6A, 7A and 8A are perspective views illustrating steps of forming a semiconductor substrate according to embodiments of the present invention. FIGS. 2B, 3B, 4B, 5B, 6B, 7B and 8B are cross-sectional views taken along lines III–III' of FIGS. 2A, 3A, 4A, 5A, 6A, 7A and 8A, respectively, and FIGS. 2C, 3C, 4C, 5C, 6C, 7C, and 8C are cross-sectional views taken along lines IV–IV' of FIGS. 2A, 3A, 4A, 5A, 6A, 7A and 8A, respectively.

Figure 2A:
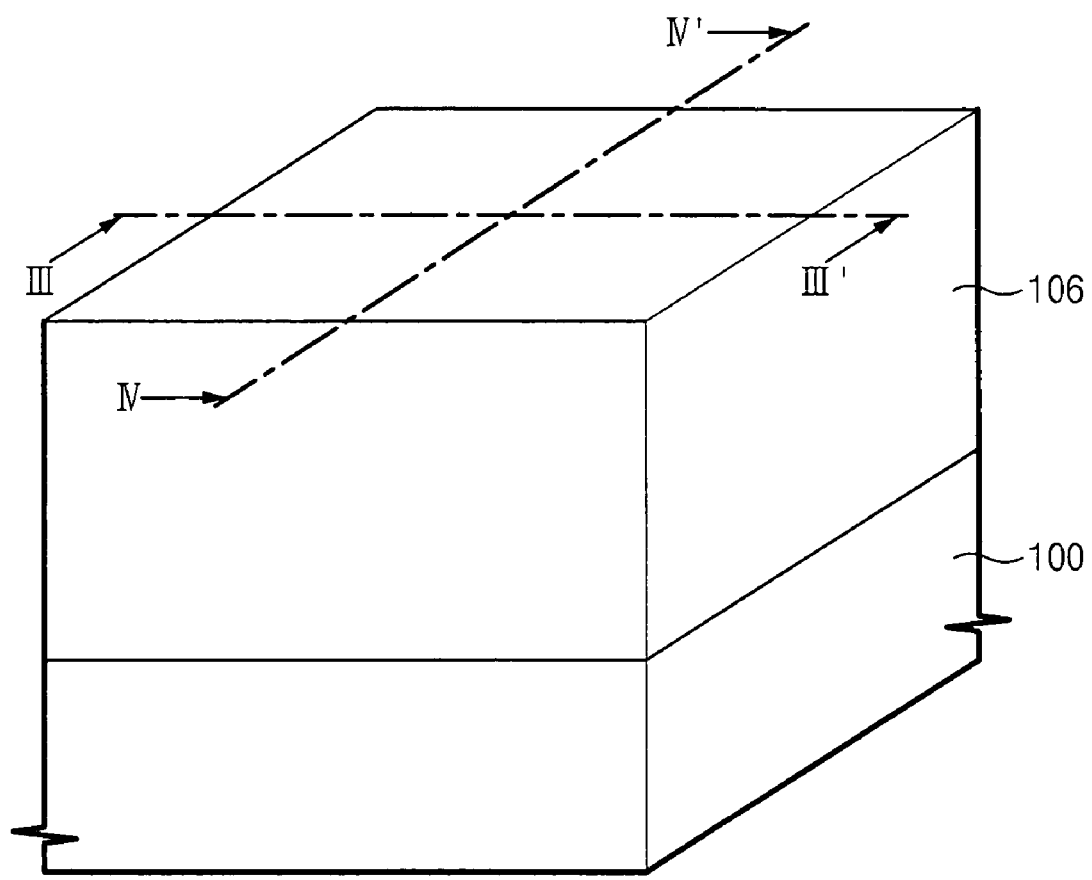
FIGS. 2A, 3A, 4A, 5A, 6A, 7A, and 8A are perspective views illustrating steps of forming a semiconductor substrate according to embodiments of the present invention.
Figure 2B:
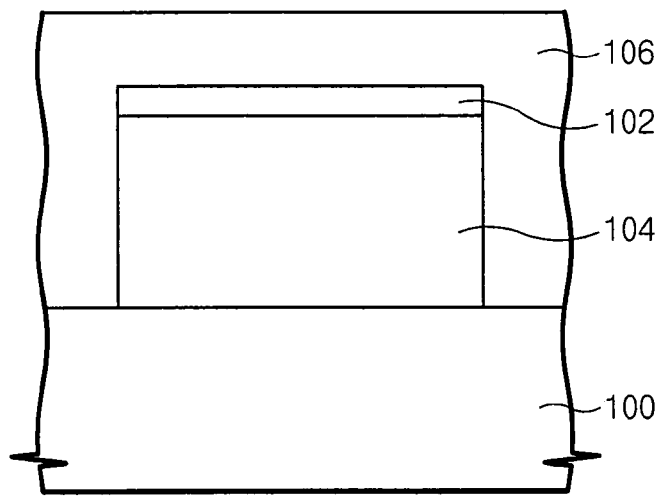
FIGS. 2B, 3B, 4B, 5B, 6B, 7B and 8B are cross-sectional views taken along lines III–III' of FIGS. 2A, 3A, 4A, 5A, 6A, 7A, and 8A, respectively.
Figure 2C:
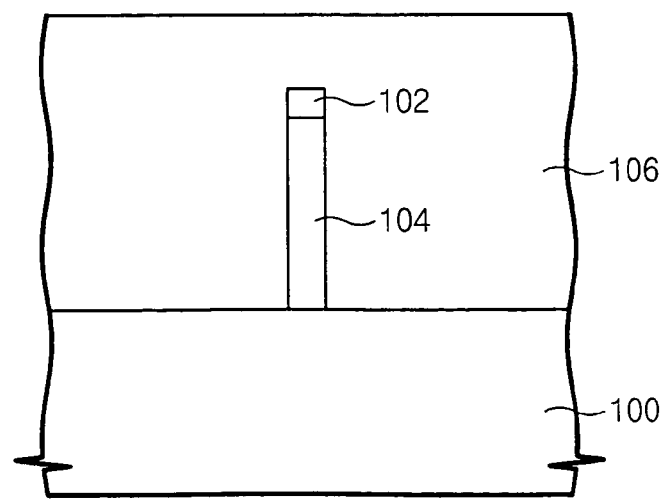
FIGS. 2C, 3C, 4C, 5C, 6C, 7C, and 8C are cross-sectional views taken along lines IV–IV' of FIGS. 2A, 3A, 4A, 5A, 6A, 7A, and 8A, respectively.

Referring to FIGS. 2A, 2B and 2C, a first hard mask layer may be formed on a substrate 100 and patterned to form a first hard mask pattern 102. The substrate 100 may be a silicon substrate. The first hard mask pattern 102 may be formed of a material having an etch selectivity with respect to the substrate 100. More particularly, the first hard mask pattern 102 may be formed of silicon nitride. The first hard mask pattern 102 may also include a buffer insulation layer formed between the silicon nitride and the substrate 100.

The substrate 100 is etched using the first hard mask pattern 102 as an etch mask to form a preliminary fin pattern 104. The preliminary fin pattern 104 protrudes from the substrate 100. A mold layer 106 is formed on a surface of the substrate 100 having the preliminary fin pattern 104. The mold layer 106 may be formed of a chemical vapor deposition (CVD) silicon oxide or a spin-on-glass (SOG) layer.

Figure 3A:
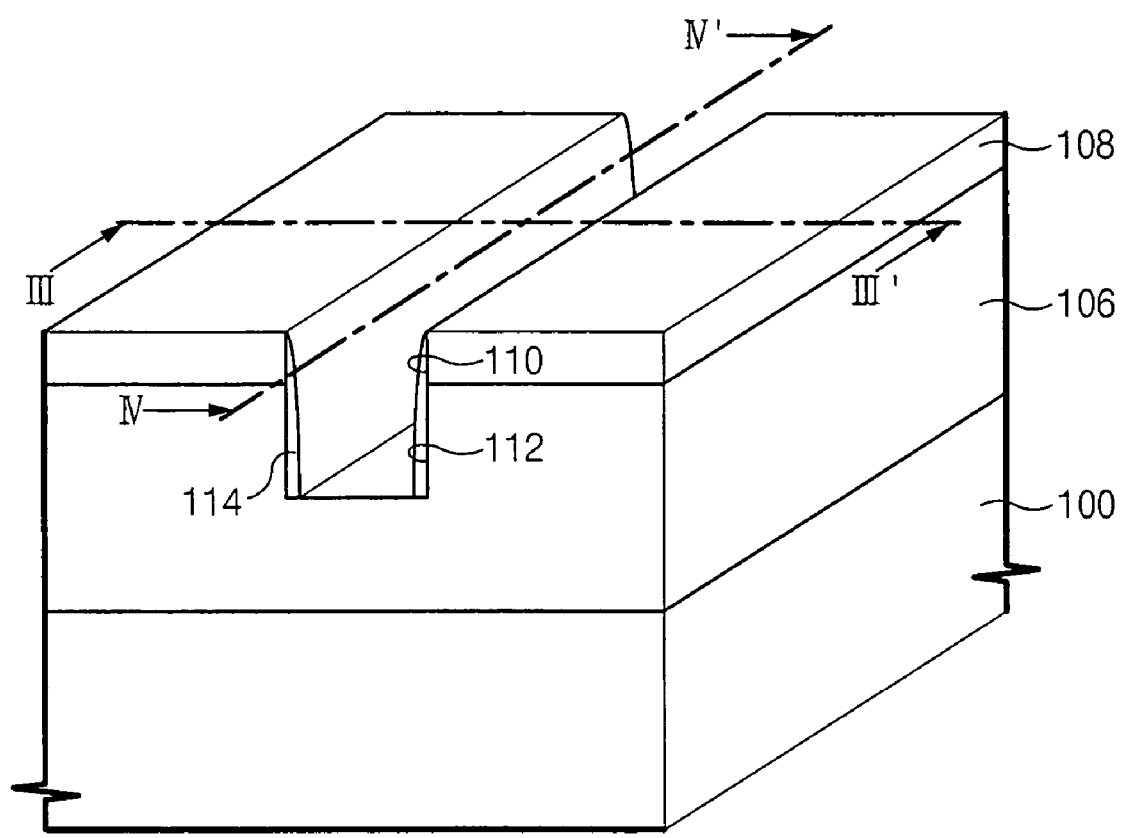
Figure 3B:
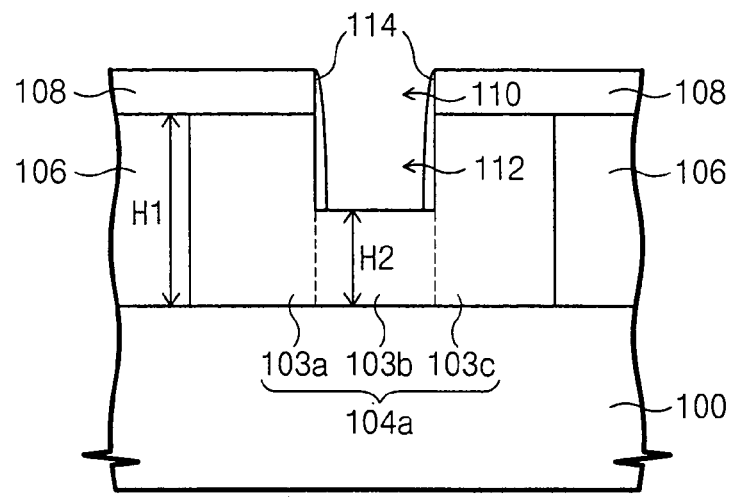
Figure 3C:
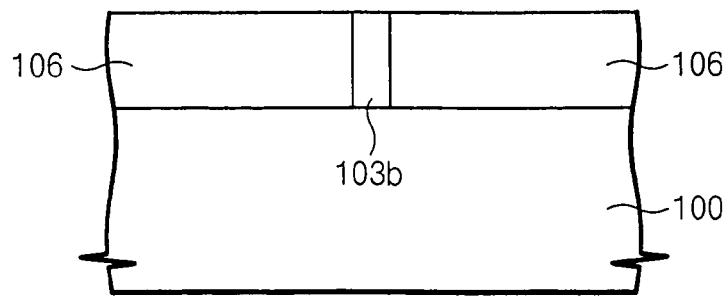

Referring to FIGS. 3A, 3B and 3C, the mold layer 106 may be planarized until the first hard mask pattern 102 is exposed. The first hard mask pattern 102 can then be removed to expose the preliminary fin pattern 104, and the planarized mold layer 106 may be recessed to have a height similar or identical to a height of a top surface of the preliminary fin pattern 104.

Alternatively, the first hard mask pattern 102 may be removed before forming the mold layer 106. In this case, the first hard mask pattern 102 is removed, and then the mold layer 106 is formed. The mold layer 106 may then be planarized until the preliminary fin pattern 104 is exposed.

A second hard mask layer 108 may be formed on a surface of the substrate having the exposed preliminary fin pattern 104, and the second hard mask layer 108 may be patterned to form an opening 110 exposing predetermined regions of the preliminary fin pattern 104 and the mold layer 106. The opening 110 crosses over the preliminary fin pattern 104. The second hard mask layer 108 is formed of a material having an etch selectivity with respect to the mold layer 106 and the preliminary fin pattern 104. The second hard mask layer 108, for example may be formed of silicon nitride.

Portions of the mold layer 106 and the preliminary fin pattern 104 exposed by the opening 110 are etched using the second hard mask layer 108 as an etch mask to form a fin pattern 104a and a preliminary groove 112 crossing over the fin pattern 104a. To form the preliminary groove 112, the exposed preliminary fin pattern 104 may be etched to form the fin pattern 104a, and then the exposed mold layer 106 may be etched to have a height similar or identical to an etched part of the fin pattern 104a. Alternatively, after etching the exposed mold layer 106 to a predetermined depth, the exposed preliminary fin pattern 104 may be etched. Furthermore, the exposed mold layer 106 and the preliminary fin pattern 104 may be simultaneously etched using an etch recipe having a substantially identical etch rate with respect to the exposed mold layer 106 and the exposed preliminary fin pattern 104.

Consequently, the fin pattern 104a has a source region 103a, a channel region 103b and a drain region 103c due to the formation of the preliminary groove 112. The source/drain region 103a and 103c having a first height H1 have a greater height than the channel region 103b having a second height H2. The source/drain regions 103a and 103c are in contact with respective sidewalls of the channel region 103b. That is, parts of the fin pattern 104a positioned at both sides of the preliminary groove 112 correspond to the source/drain region 103a and 103c, and a part of the fin pattern 104a at a bottom surface of the preliminary groove 112 corresponds to the channel region 103b.

Spacers 114 are formed at both sidewalls of the opening 110 and the preliminary groove 112. The spacers 114 may be formed using an insulation material having an etch selectivity with respect to the mold layer 106. For example, the spacer 114 may be formed of silicon nitride.

Figure 4A:
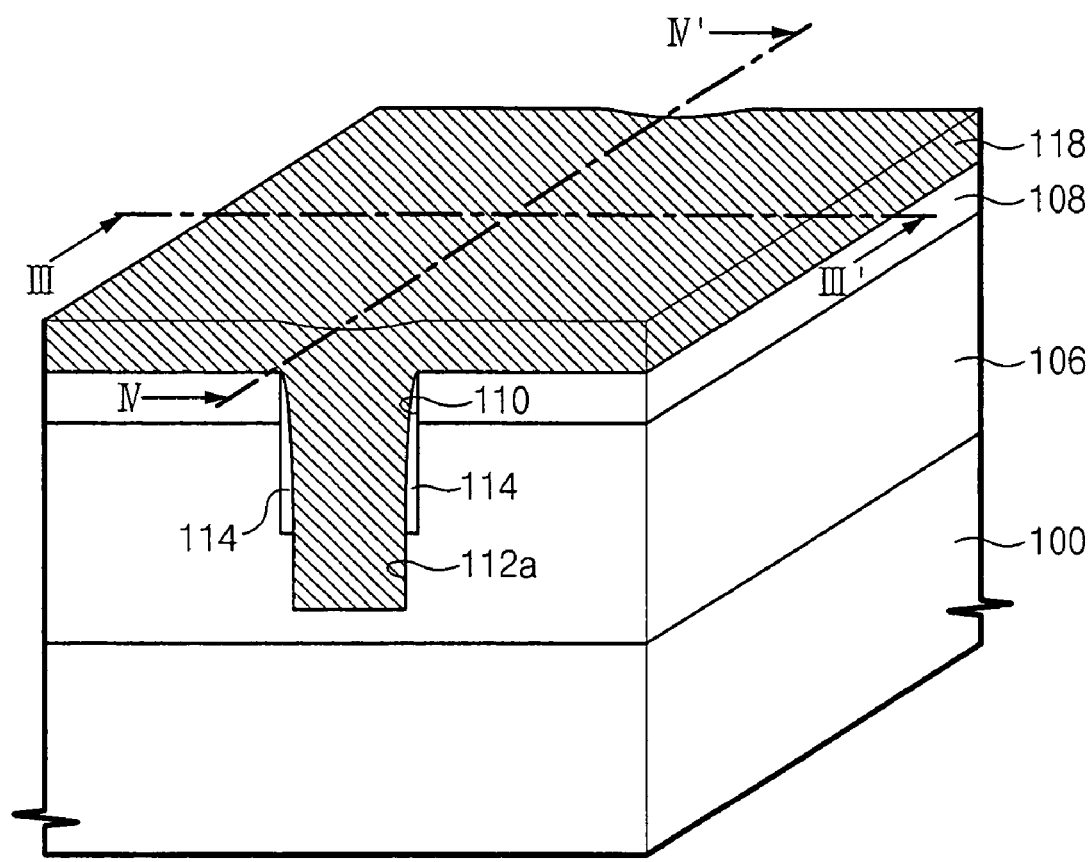
Figure 4B:
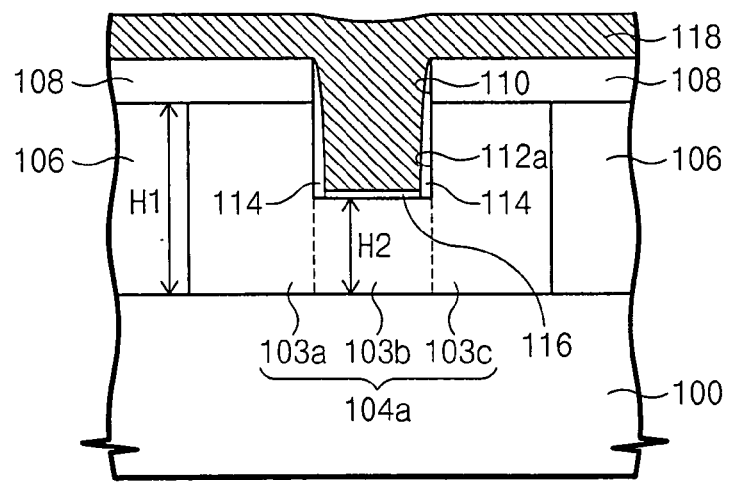
Figure 4C:
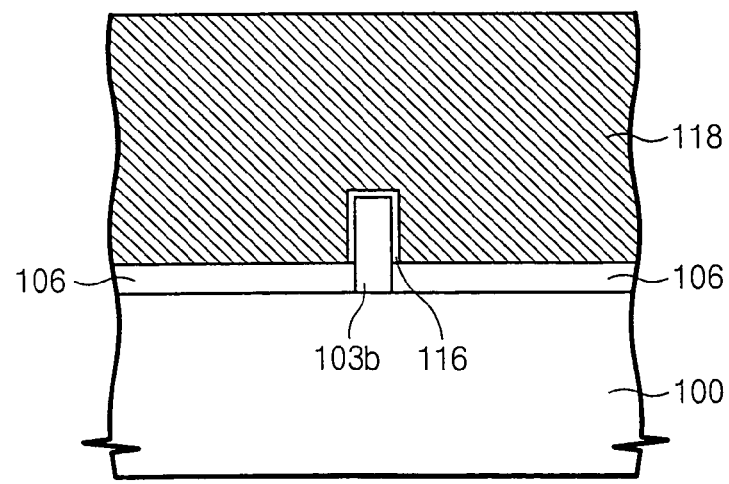
Figure 5A:
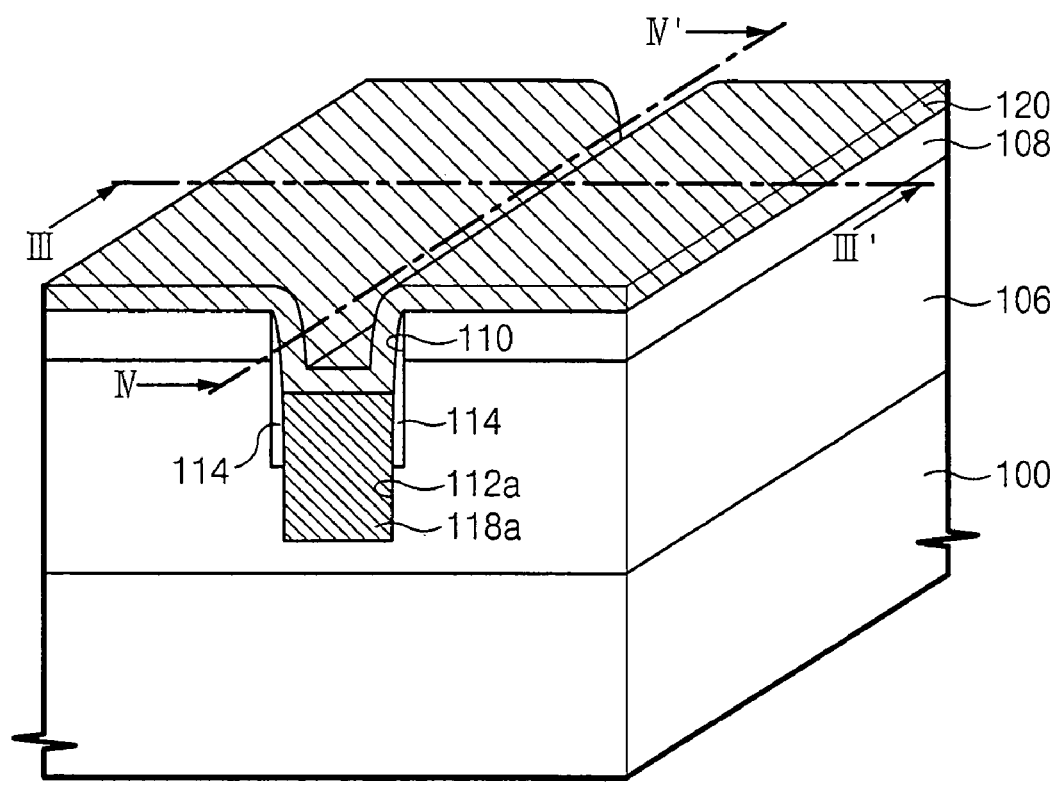
Figure 5B:
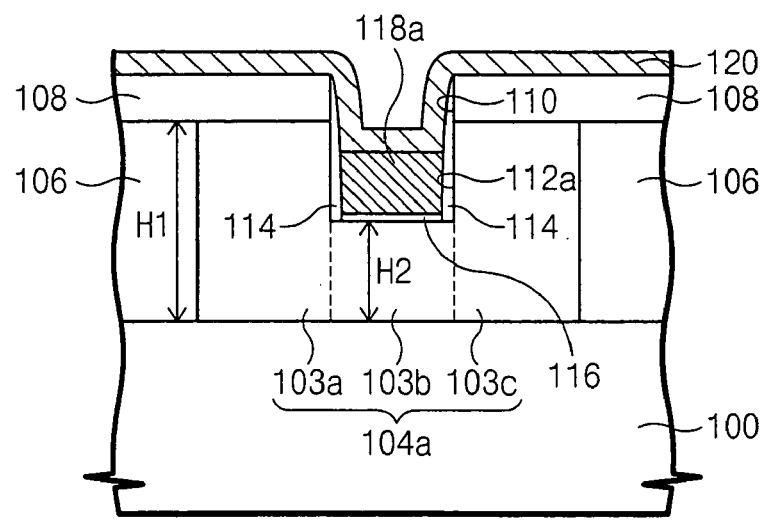
Figure 5C:
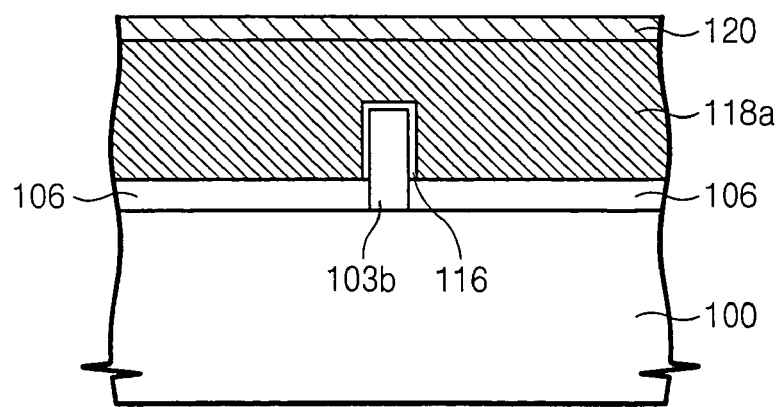
Figure 6A:
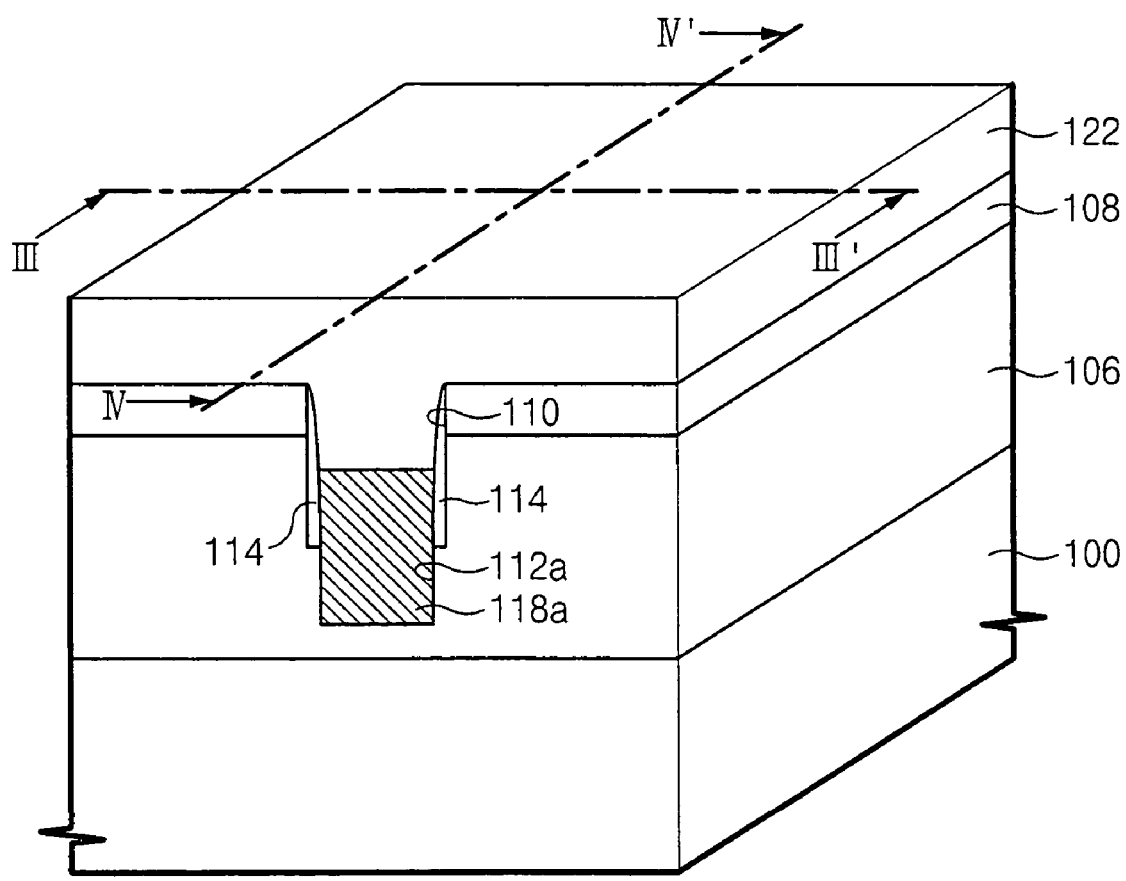
Figure 6B:
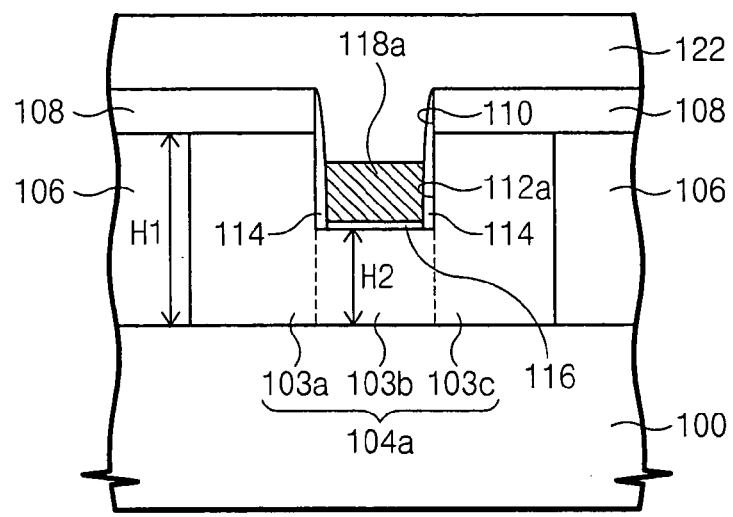
Figure 6C:
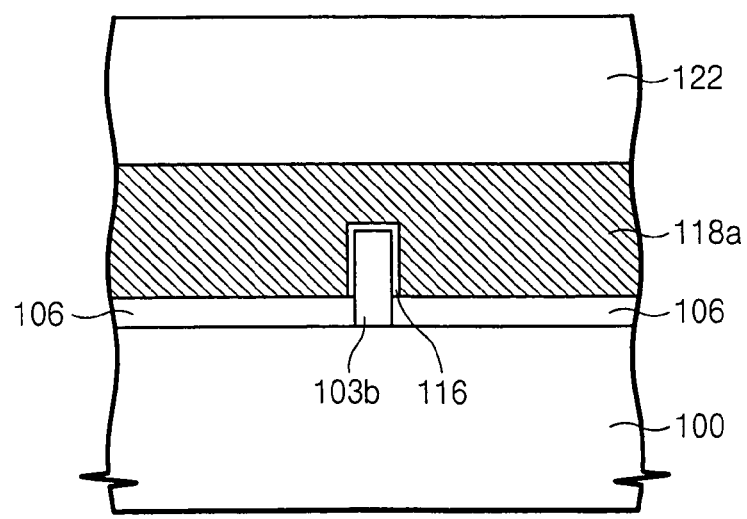
Figure 7A:
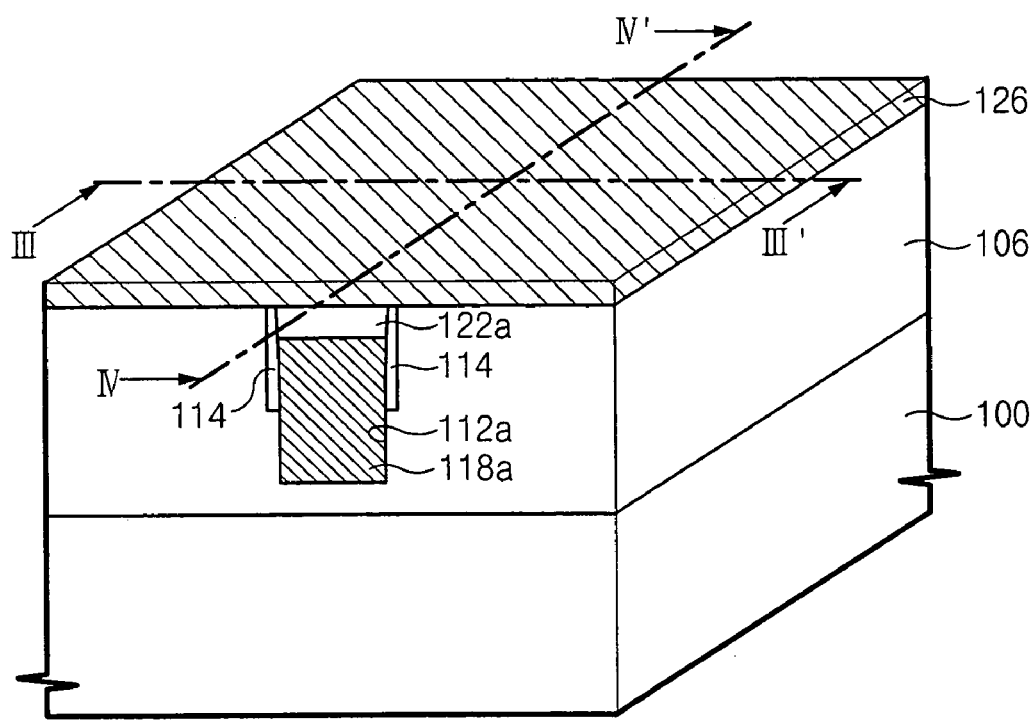
Figure 7B:
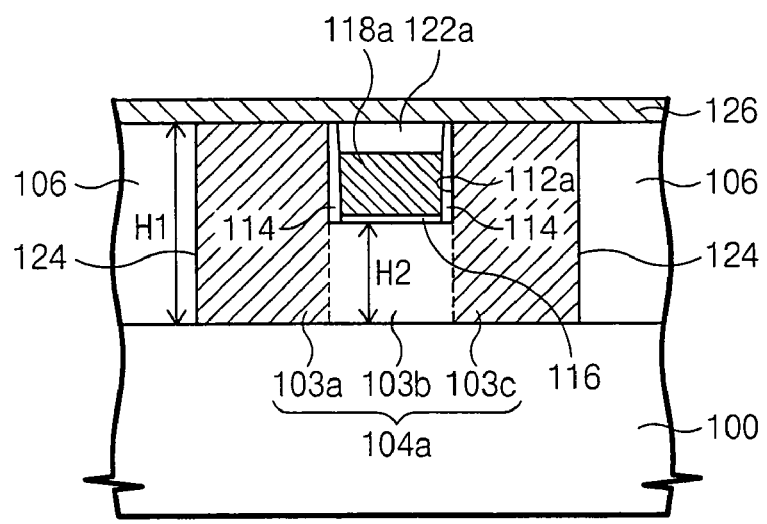
Figure 7C:
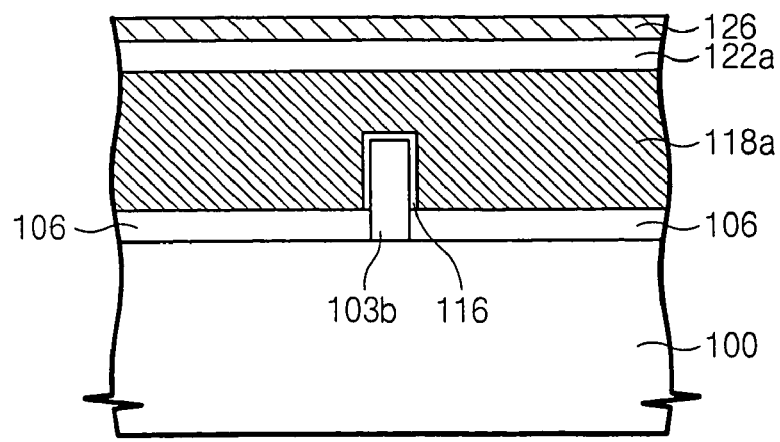
Figure 8A:
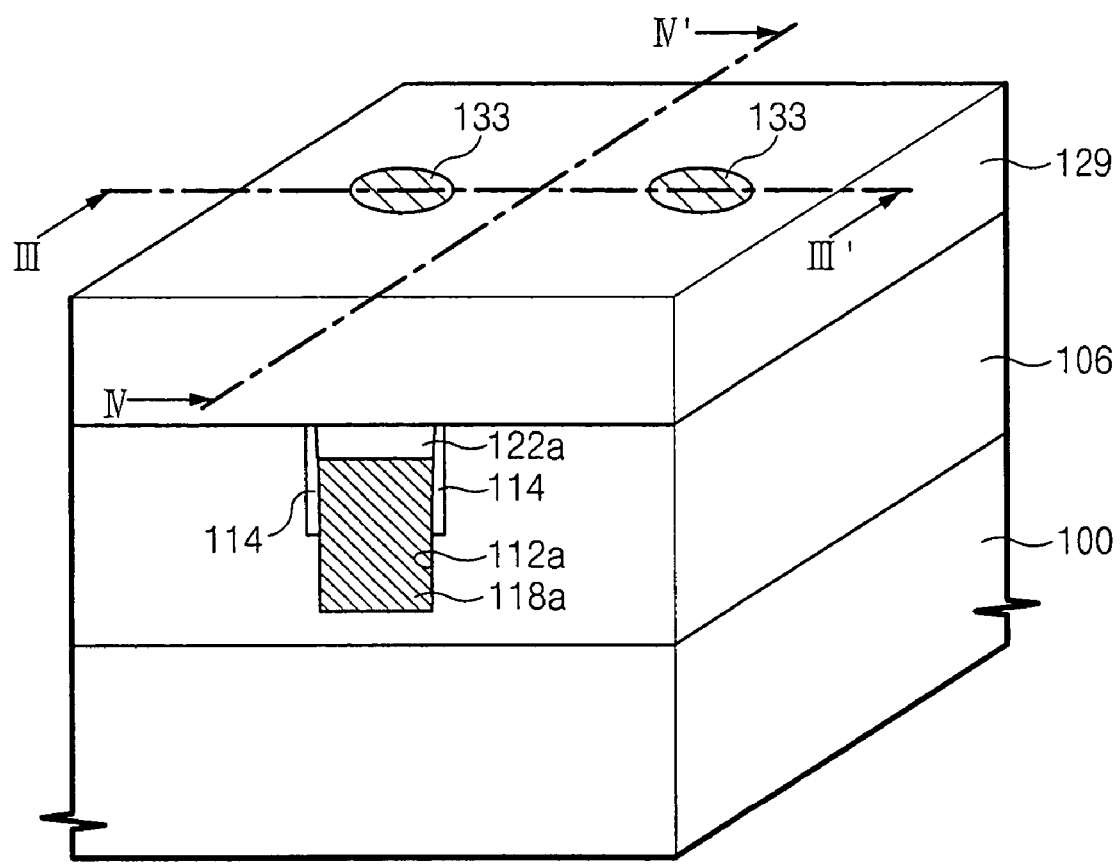
Figure 8B:
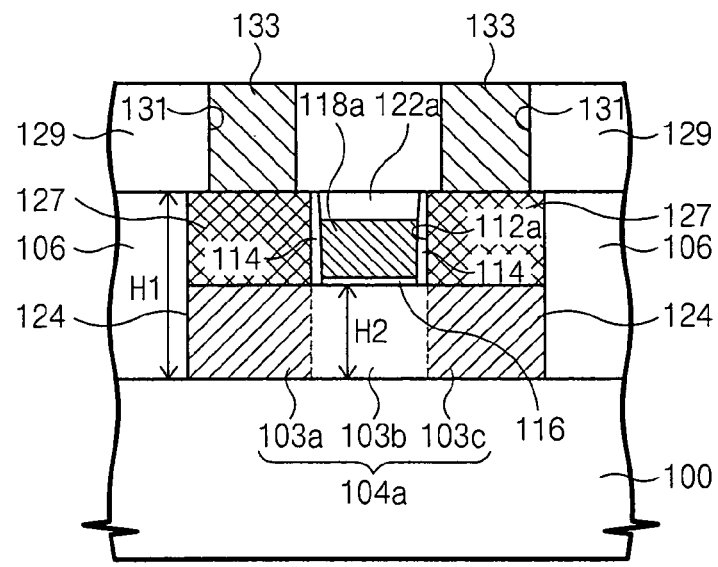
Figure 8C:
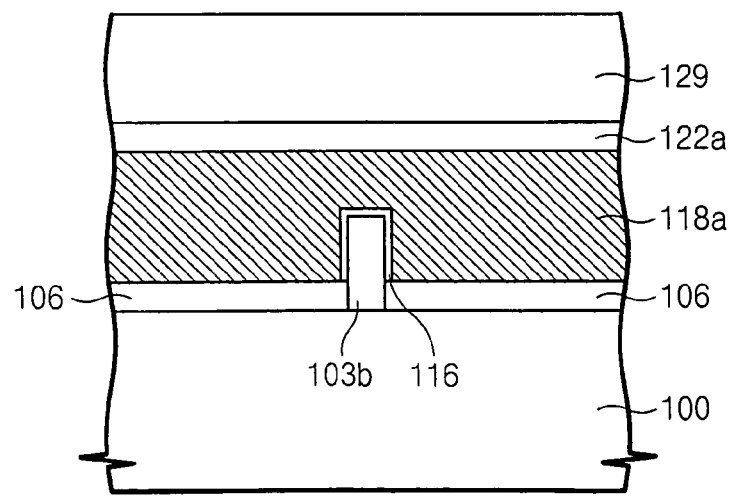

Referring to FIGS. 4A, 4B and 4C, the mold layer 106 at a bottom surface of the preliminary groove 112 is selectively recessed using the second hard mask layer 108 and the spacer as etch masks to form a groove 112a. A portion of the channel region 103b protrudes from a bottom surface of the groove 112a. The groove 112a exposes a top surface and both sidewalls of the protruding portion of the channel region 103b. The inner sidewalls of the groove 112a may have a step shape due to the spacers 114.

A surface treatment process may be performed to cure etch damage at an exposed surface of the channel region 103b. The surface treatment process may be performed using a hydrogen annealing process. The hydrogen annealing process may be performed at a process temperature in the range of about 600 degrees Celsius to about 900 degrees Celsius.

Impurity ions may be implanted to control a threshold voltage of the exposed channel region 103b. At this time, the impurity ions controlling the threshold voltage may be selectively implanted only into the channel region 103b due to the second hard mask layer 108. That is, the impurity ions are not implanted into the source/drain regions 103a and 103c. Thus, it may be possible to reduce a junction leakage current which may be caused by alternatively implanting impurities of different types into the source/drain regions.

In the case that impurities of different types are alternatively implanted in a source/drain region, a doping concentration of a part adjacent to a junction may be increased to thin a depletion layer adjacent to the junction. Thus, a junction leakage current directly tunneling through the depletion layer may occur. Methods according to embodiments of the present invention can reduce junction leakage currents.

After implanting impurity ions to control threshold voltages, a process such as a hydrogen annealing process may be performed to cure damage that may occur due to the implantation of ions into the channel region 103b.

A gate insulation layer 116 may be formed on at least an exposed surface of the channel region 103b. The gate insulation layer 116 may be formed of silicon oxide. More particularly, the gate insulation layer 116 may be formed of a thermal grown silicon oxide. Alternatively, the gate insulation layer 116 may be formed of a chemical vapor deposition (CVD) silicon oxide.

A gate conductive layer 118 may be formed on an entire surface of the substrate 100 having the gate insulation layer 116 to fill the groove 112a. The gate conductive layer 118 may be formed of a doped polysilicon. Alternatively, the gate conductive layer 118 may be formed of a conductive metal-containing layer such as titanium nitride, tantalum nitride, tungsten nitride, and/or molybdenum.

Referring to FIGS. 5A, 5B, 5C, 6A, 6B and 6C, the gate conductive layer 118 may be planarized until the second hard mask layer 108 is exposed, and the planarized gate conductive layer 118 may be recessed to form a gate electrode 118a having a height lower than that of a top surface of the mold layer 106. The top surface of the gate electrode 118a has a height relative to the substrate higher than that of the gate insulation layer 116. The gate electrode 118a is interposed between the spacers 114 formed on the inner sidewalls of the groove 114. Thus, the gate electrode 118a is electrically isolated from the source/drain regions 103a and 103c.

During the planarization process and/or the recess process used to form the gate electrode 118a, the gate insulation layer 116 may remain unexposed. Thus, it is possible to reduce a degradation of characteristics of a transistor that may occur due to damaging the gate oxide layer at the edge of the gate electrode.

When the gate electrode 118a is formed of a doped polysilicon, a part or an entirety of the gate electrode 118a may be formed of metal silicide. After forming the gate electrode 118a, a first metal layer 120 may be deposited on a surface of the substrate 100 and a silicidation process may be performed to change a part or the entirety of the gate electrode 118a into a metal silicide. A part or the entirety of the gate electrode 118a may be metal-silicided by controlling a thickness of the first metal layer 120 and/or by controlling a process time and/or temperature of the silicidation process.

Depositing the first metal layer 120 and the silicidation thereof may be performed in an in-situ manner. That is, an inner temperature of a process chamber (not illustrated) for depositing the first metal layer 120 or a temperature of a wafer chuck (not illustrated) where the substrate 100 is loaded may be maintained as a process temperature of the silicidation process. Thus, as soon as the first metal layer 120 is deposited on the substrate 100, the first metal layer 120 may react with the doped polysilicon to change a part or the entirety of the gate electrode 118a. The first metal layer 120 may be formed of a refractory metal such as nickel, cobalt, and/or titanium. Thus, a part or the entirety of the gate electrode 118a may be formed of a silicide including a refractory metal such as nickel silicide, cobalt silicide, and/or titanium silicide. After forming the silicide, an unreacted portion of the first metal layer 120 may be removed from the substrate 100.

Alternatively, in the event that the gate electrode 118a is formed of a conductive metal-containing layer, the process of depositing the first metal layer 120 and the silicidation process may be omitted.

A capping layer 122 may then be formed on a surface of the substrate 100 having the gate electrode 118a, thereby filling the groove 112a.

Referring to FIGS. 7A, 7B, 7C, 8A, 8B and 8C, the capping layer 122, the spacer 114 and the second hard mask layer 108 may be planarized until the mold layer 106 and the source/drain regions 103a and 103c of the fin pattern 104a are exposed. A capping pattern 122a may thus be formed on the gate electrode 118a.

Impurity-ions are implanted to form impurity-doped regions 124 of fin pattern 104a on the both sides of the gate electrode 118a. A projected range Rp of the impurity ions in the gate electrode 118a may be lower than that in the fin pattern 104a because the gate electrode 118a may be formed of a metal silicide or a conductive metal-containing layer. Thus, the impurity ions may be selectively implanted into the source/drain regions 103a and 103c and not substantially implanted into the channel region 103b. Furthermore, the capping pattern 122a may be formed of an insulating material having a lower projected range of impurity ions than the fin pattern 104a. Thus, the channel region 103b can be protected from the impurity ions used to form the impurity-doped regions 124. The capping pattern 122a may have an etch selectivity with respect to an interlayer dielectric layer which may be formed in a subsequent step. For example, the capping pattern 122a may be formed of silicon nitride. Silicon nitride may have a lower projected range of impurity ion penetration than the fin pattern 104a formed of silicon, and silicon nitride may have an etch selectivity with respect to silicon oxide which can be used as the subsequently formed interlayer dielectric layer.

Because the spacer 114 may be formed of silicon nitride, portions of the channel region 103b under the spacer 114 can be protected while implanting impurity ions used to form the impurity-doped regions 124.

After implanting the impurity ions, a thermal process may be used to electrically activate the implanted impurities and to recrystallize lattice damage. The thermal process may also diffuse the implanted impurities to extend the impurity-doped region 124 to the channel region 103b under the spacer 114. The impurity-doped regions 124 correspond to source/drain regions of a fin FET.

A second metal layer 126 is formed at a surface of the substrate 100 having the impurity-doped region 124, and a silicidation process may be performed to form metal silicide layer 127 at parts of the impurity-doped regions 124, respectively. At this time, a bottom surface of the metal silicide layers 127 may have a height similar or identical with respect to a top surface of the channel region 103b. The height of the bottom surface of the metal silicide layers 127 may be controlled using a process time and/or temperature of a silicidation process and/or a thickness of the second metal layer 126.

The second metal layer 126 can be formed of a refractory metal such as a nickel, cobalt, and/or titanium. Thus, the metal silicide layers 127 may be formed of a silicide containing a refractory metal such as nickel silicide, cobalt silicide, and/or titanium silicide. After forming the metal silicide layer 127, unreacted portions of metal layer 126 may be removed.

Consequently, since the metal silicide layer 127 is formed in the source/drain regions 103a and 103c having a greater height H1 than the heighte H2 of the channel region 103b, the metal silicide layer 127 may have a sufficient thickness. Thus, the metal silicide layer 127 can be continuously formed to reduce a resistance of source/drain regions of a fin FET.

Generally, in the event that a width of a metal silicide is relatively narrow and/or thin with respect to a grain size of the metal silicide, the metal silicide can be discontinuously formed. On the contrary, since the metal silicide layer 127 can be formed relatively thick, the metal silicide layer 127 may be formed continuously. Additionally, since the metal silicide layer 127 may be relatively far from both sides of the channel region 103b, degradation of characteristics of a semiconductor device that may occur due to diffusion of the metal elements in the metal silicide layer 127 into the channel region 103b may be reduced.

After un-reacted portions of second metal layer 126 are removed, an interlayer dielectric layer 129 may be formed on a surface of the substrate 100. The interlayer dielectric layer 129 can be formed of silicon oxide. The interlayer dielectric layer 129 may be patterned to form contact holes 131 exposing the metal silicide layers 127 of the source/drain regions, respectively. A conductive via 133 (also referred to as an upper conductor) may then be formed in the contact hole 131.

When the contact hole 131 is formed, although a misalignment may occur, the gate electrode 118a may be protected by the capping pattern 122a so that the gate electrode 118a is not electrically coupled with the conductive via 133. A contact resistance between the source/drain regions and the conductive via 133 can be effectively reduced due to the metal silicide layer 127, thereby improving characteristics of a semiconductor device.

In methods of forming a semiconductor device described above, the impurity-doped regions 124 may be formed after forming the gate electrode 118a. Alternatively, the impurity-doped regions 124 may be formed before forming the gate electrode 118a. This alternative will be explained with reference to FIGS. 9A, 9B and 9C.

Figure 9A:
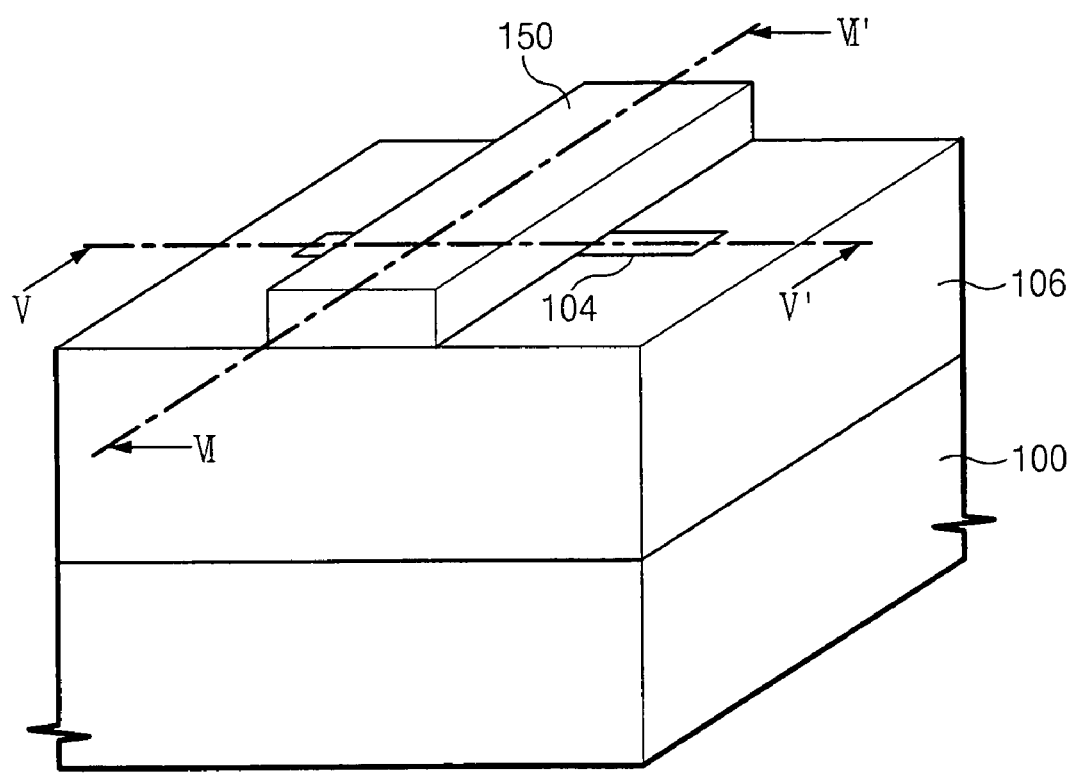
FIG. 9A is a perspective view illustrating forming impurity-doped regions in a semiconductor substrate according to embodiments of the present invention.
Figure 9B:
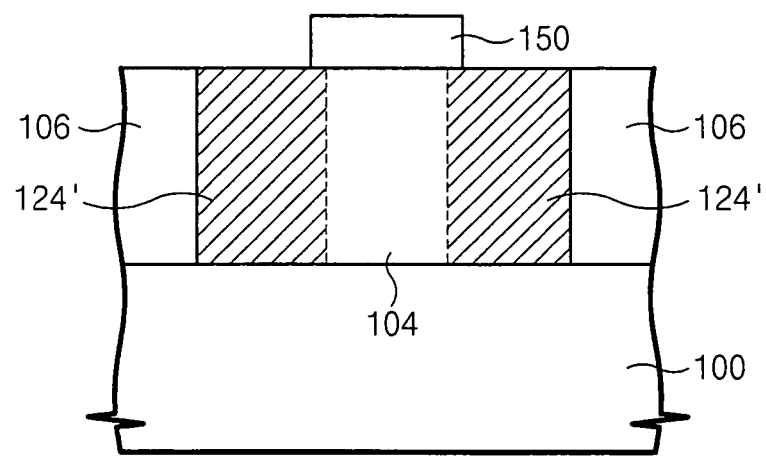
FIG. 9B is a cross-sectional view taken along line V–V' of FIG. 9A.
Figure 9C:
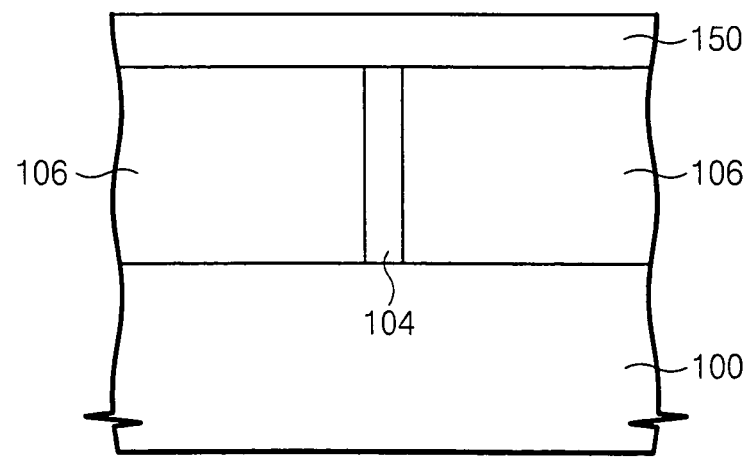
FIG. 9C is a cross-sectional view taken along line VI–VI' of FIG. 9A.

FIG. 9A is a perspective view illustrating steps of forming impurity-doped regions in a semiconductor substrate according to embodiments of the present invention. FIG. 9B is a cross-sectional view taken along line V–V' of FIG. 9A. FIG. 9C is a cross-sectional view taken along line VI–VI' of FIG. 9A.

Referring to FIGS. 9A, 9B and 9C, a mask layer is formed on a planarized mold layer 106 and on an exposed preliminary fin pattern 104. The mask layer is patterned to form a mask pattern 150 crossing over the preliminary fin pattern 104. Prior to forming the mask layer, the mold layer 106 may be planarized to expose the preliminary fin pattern 104 as discussed above with respect to FIGS. 2A–C and 3A–C.

The mask pattern 150 may be formed of a photoresist. The mask pattern 150 may be formed at a position where the preliminary groove 112 of FIG. 3A will be formed where a gate electrode 118a of FIG. 5A will be formed. Impurity ions are implanted using the mask pattern 150 as a mask to form an impurity-doped region 124' in the preliminary fin pattern 104 at both sides of the mask pattern 150. At this time, the mask pattern 150 may have a width greater than the gate electrode 118a of FIG. 5A, because the impurity-doped region 124' can be extended by diffusion of impurities in the thermal treatment process of electrically activating impurities and curing lattices after implanting the impurity ions. An alignment margin of a gate electrode 118a of FIG. 5A and the mask pattern 150 may be obtained by forming the mask pattern 150 to have a width greater than the gate electrode 118a.

After forming the impurity-doped regions 124', the mask pattern 150 is removed. Then, subsequent processes can be performed as discussed above with respect to FIGS. 3A–C, 4A–C, 5A–C, 6A–C, 7A–C, and 8A–C. At this time, a step of forming an impurity-doped region 124 discussed above with respect to FIGS. 7A–C can be omitted and a capping layer 122 of FIG. 6A may be formed of silicon oxide.

According to embodiments of the present invention, a fin pattern protruding from a substrate may include a channel region and source/drain regions connected to opposite sides of the channel region. The source/drain regions may be higher than the channel region. A metal silicide layer having a sufficient thickness may be formed at the source/drain regions. As a result, a contact resistance between the source/drain regions and a conductive via (also referred to as an upper conductor) may be reduced to improve characteristics of a semiconductor device.

A gate electrode crossing over a top surface and both sidewalls of the channel region may be formed using a planarization or recess process in a groove formed in the fin pattern and a mold layer. At this time, a gate insulation layer under the gate electrode may be covered during the planarization or recess process. Thus, it is possible to reduce characteristic degradation of a fin FET that may result from etch damage of a gate oxide layer at sides of a gate electrode.

Furthermore, impurity ions can be selectively implanted into the channel, the source region and the drain region. Thus, junction leakage of source/drain regions of the fin FET can be reduced.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. A semiconductor device comprising:
   a fin structure extending from a substrate, the fin structure including first and second source/drain regions and a channel region therebetween, wherein the first and second source/drain regions extend a greater distance from the substrate than the channel region;
   a gate insulating layer on the channel region;
   a gate electrode on the gate insulating layer so that the gate insulating layer is between the gate electrode and the channel region; and
   an insulating mold layer on the substrate and adjacent the fin structure wherein surfaces of the first and second source/drain regions are exposed through the insulating mold layer, the insulating mold layer having a groove therein extending through a gap in the fin structure between the first and second source/drain regions.

2. A semiconductor device according to claim 1 wherein the gate insulating layer is on sidewalls of the channel region and on a surface of the channel region opposite the substrate.

3. A semiconductor device according to claim 1 wherein portions of the first and second source/drain regions adjacent the channel region comprise an impurity doped semiconductor material.

4. A semiconductor device according to claim 1 wherein the gate electrode comprises doped polysilicon, a polycide, a metal silicide, a material including a conductive metal, and/or combinations thereof.

5. A semiconductor device according to claim 1 wherein a portion of the channel region extends into the groove.

6. A semiconductor device according to claim 5 wherein the gate electrode is in the groove on opposite sides of the portions of the channel region extending into the groove.

7. A semiconductor device according to claim 1 wherein sidewalls of the groove expose portions of the first and second source/drain regions extending beyond the channel region.

8. A semiconductor device according to claim 7 further comprising:
    insulating spacers on sidewalls of the groove and on the portions of the first and second source/drain regions exposed by the groove.

9. A semiconductor device according to claim 1 further comprising:
    an insulating capping layer on the gate electrode such that the gate electrode is between the insulating capping layer and the substrate.

10. A semiconductor device according to claim 9 wherein the insulating capping layer comprises an insulating material having a projected implant range lower than a projected implant range of the fin structure when implanting impurity ions.

11. A semiconductor device according to claim 1 wherein the fin structure and the substrate both comprise a same semiconductor material.

12. A semiconductor device according to claim 1 wherein the fin structure and the substrate both comprise silicon.

13. A semiconductor device comprising:
    a fin structure extending from a substrate, the fin structure including first and second source/drain regions and a channel region therebetween, wherein the first and second source/drain regions extend a greater distance from the substrate than the channel region;
    a gate insulating layer on the channel region; and
    a gate electrode on the gate insulating layer so that the gate insulating layer is between the gate electrode and the channel region;
    wherein portions of the first and second source/drain regions comprise a metal silicide, wherein a least distance of the metal silicide from the substrate is at least as great as a distance that the channel region extends from the substrate, and wherein the gate insulating layer is on sidewalls of the channel region and on a surface of the channel region opposite the substrate.

14. A semiconductor device according to claim 13 wherein portions of the first and second source/drain regions adjacent the channel region comprise an impurity doped semiconductor material.

15. A semiconductor device according to claim 13 wherein the gate electrode comprises doped polysilicon, a polycide, a metal silicide, a material including a conductive metal, and/or combinations thereof.

16. A semiconductor device according to claim 13 wherein the fin structure and the substrate both comprise a same semiconductor material.

17. A semiconductor device according to claim 13 wherein the fin structure and the substrate both comprise silicon.

18. A semiconductor device comprising:
    a fin structure extending from a substrate, the fin structure including first and second source/drain regions and a channel region therebetween, wherein the first and second source/drain regions extend a greater distance from the substrate than the channel region wherein portions of the first and second source/drain regions comprise a metal silicide, and wherein a least distance of the metal silicide from the substrate is at least as great as a distance that the channel region extends from the substrate;
    a gate insulating layer on the channel region;
    a gate electrode on the gate insulating layer so that the gate insulating layer is between the gate electrode and the channel region; and
    an insulating mold layer on the substrate and adjacent the fin structure wherein surfaces of the first and second source/drain regions are exposed through the insulating mold layer, the insulating mold layer having a groove therein extending through a gap in the fin structure between the first and second source/drain regions.

19. A semiconductor device according to claim 18 wherein a portion of the channel region extends into the groove.

20. A semiconductor device according to claim 19 wherein the gate electrode is in the groove on opposite sides of the portions of the channel region extending into the groove.

21. A semiconductor device according to claim 18 wherein sidewalls of the groove expose portions of the first and second source/drain regions extending beyond the channel region.

22. A semiconductor device according to claim 21 further comprising:
    insulating spacers on sidewalls of the groove and on the portions of the first and second source/drain regions exposed by the groove.

23. A semiconductor device according to claim 18 further comprising:
    an insulating capping layer on the gate electrode such that the gate electrode is between the insulating capping layer and the substrate.

24. A semiconductor device according to claim 23 wherein the insulating capping layer comprises an insulating material having a projected implant range lower than a projected implant range of the fin structure when implanting impurity ions.

* * * * *